(12) United States Patent
Xu et al.

(10) Patent No.: US 10,756,285 B2
(45) Date of Patent: Aug. 25, 2020

(54) DISPLAY PANEL, ELECTROLUMINESCENT PANEL AND MANUFACTURING METHOD THEREOF

(71) Applicant: BOE TECHNOLOGY GROUP CO., LTD., Beijing (CN)

(72) Inventors: Wei Xu, Beijing (CN); Pengxia Liang, Beijing (CN); Xin Gu, Beijing (CN); Kang Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/989,699

(22) Filed: May 25, 2018

(65) Prior Publication Data

US 2018/0331313 A1 Nov. 15, 2018

Related U.S. Application Data

(63) Continuation-in-part of application No. PCT/CN2017/105990, filed on Oct. 13, 2017.

(30) Foreign Application Priority Data

Feb. 27, 2017 (CN) .......................... 2017 1 0109101

(51) Int. Cl.
*H01L 51/50* (2006.01)
*H01L 51/52* (2006.01)
(Continued)

(52) U.S. Cl.
CPC ........ *H01L 51/502* (2013.01); *H01L 27/3227* (2013.01); *H01L 51/426* (2013.01);
(Continued)

(58) Field of Classification Search
None
See application file for complete search history.

(56) References Cited

U.S. PATENT DOCUMENTS

2005/0236556 A1   10/2005  Sargent et al.
2009/0108757 A1*  4/2009   Lee ........................ H01L 27/288
                                                              315/51
(Continued)

FOREIGN PATENT DOCUMENTS

CN      1533614 A        9/2004
CN    101162762 A        4/2008
(Continued)

OTHER PUBLICATIONS

First Office Action for Chinese Patent Application No. 201710109101.6 dated Jan. 3, 2018.
(Continued)

*Primary Examiner* — Michelle Mandala
*Assistant Examiner* — Jordan M Klein
(74) *Attorney, Agent, or Firm* — Calfee, Halter & Griswold LLP

(57) ABSTRACT

This disclosure relates to a display panel, an electroluminescent device and a manufacturing method for the electroluminescent device. The electroluminescent device includes a first transparent electrode layer, an electroluminescent layer, a channel layer, a second transparent electrode layer, a dielectric layer, a light absorption layer and a third electrode layer stacked in turn, wherein the light absorption layer can be excited by a light emitted from the electroluminescent layer to generate photocarriers. The present disclosure may reduce power consumption of the panel and also reduce cost and enable products such as a panel to meet the needs for ultra-thinning and miniaturization.

14 Claims, 4 Drawing Sheets

(51) Int. Cl.
*H01L 51/56* (2006.01)
*H01L 27/32* (2006.01)
*H01L 51/42* (2006.01)

(52) U.S. Cl.
CPC .......... *H01L 51/52* (2013.01); *H01L 51/5203* (2013.01); *H01L 51/56* (2013.01); *H01L 27/322* (2013.01); *H01L 51/5096* (2013.01); *H01L 51/5296* (2013.01); *H01L 2251/5323* (2013.01); *H01L 2251/5369* (2013.01); *H01L 2251/558* (2013.01)

(56) References Cited

U.S. PATENT DOCUMENTS

| | | | |
|---|---|---|---|
| 2011/0217544 A1* | 9/2011 | Young | B29C 37/0032 428/327 |
| 2012/0326131 A1 | 12/2012 | Han | |
| 2014/0065750 A1* | 3/2014 | Harikrishna Mohan | H01L 51/5265 438/35 |
| 2014/0225087 A1* | 8/2014 | Fang | H01L 27/288 257/40 |
| 2015/0380653 A1* | 12/2015 | Liu | H01L 51/502 257/13 |
| 2018/0122869 A1* | 5/2018 | Jiang | G02F 1/133528 |

FOREIGN PATENT DOCUMENTS

| | | |
|---|---|---|
| CN | 104409475 A | 3/2015 |
| CN | 104576679 A | 4/2015 |
| CN | 204375750 U | 6/2015 |
| CN | 105261713 A | 1/2016 |
| CN | 105576004 A | 5/2016 |
| CN | 205752260 U | 11/2016 |
| CN | 106654037 A | 5/2017 |
| KR | 20150076000 A | 7/2015 |
| TW | 200919758 A | 5/2009 |

OTHER PUBLICATIONS

Search Report and Written Opinion for International Application No. PCT/CN2017/105990 dated Jan. 22, 2018.
Notification of Reexamination for Chinese Patent Application No. 201710109101.6 dated Dec. 26, 2019.
Hu Ying, "New Energy and Micro-nano Electronic Technology" (Xidian University Press, Jul. 2015, pp. 55-56).
Dai Songyuan, "Key Science of Thin Film Solar Cells and Technology", (Shanghai Science and Technology Press, Jan. 2013, pp. 357-364).

* cited by examiner

DISPLAY PANEL, ELECTROLUMINESCENT PANEL AND MANUFACTURING METHOD THEREOF

CROSS REFERENCE

This application is based on and claims priority to Chinese Patent Application No. 201710109101.6, named as "DISPLAY PANEL, ELECTROLUMINESCENT DEVICE AND MANUFACTURING METHOD THEREOF", filed Feb. 27, 2017, the entire contents thereof are incorporated herein by reference.

TECHNICAL FIELD

The present disclosure relates to a display technological field, in particular, to an electroluminescent device, a manufacturing method for the electroluminescent device and a display panel including the electroluminescent device.

BACKGROUND

At present, an active-matrix organic light-emitting diode (AMOLED) display technique has a self-luminous advantage as compared with a conventional liquid crystal display (LCD), and will gradually occupy a larger and larger share in the electronic display device technical field. As compared to the conventional LCD display, an AMOLED display have a wider viewing angle, higher refreshing rate, and smaller thickness, and thereby being widely used in smart devices such as smartphones, wristbands, and virtual reality (VR)/augmented reality (AR) and the like.

In the related art, at present, an AMOLED light-emitting device generally includes a reflective electrode. In order to avoid effects from environmental light, circular polarizers and quarter-wave plates are required, which cause loss of half luminous efficiency and increase power consumption of a panel, and also increase the production cost and the thickness of the panel. Therefore, it is desirable to provide a novel device structure to increase and improve luminous efficiency so as to reduce the power consumption of the panel, and furthermore, to reduce the cost and enable the AMOLED product to meet the needs for ultra-thinning and miniaturization.

Therefore, it is necessary to provide a new technical solution to solve one or more problems of the above solutions.

It should be noted that the Background portion contains the contents which are merely used to reinforce understanding of the background technology of the present disclosure, and thus may include information that does not constitute the prior art as already known by an ordinary person skilled in the art.

SUMMARY

An object of the present disclosure is to provide an electroluminescent device, a manufacturing method for the electroluminescent device, and a display panel including the electroluminescent device, to solve one or more problems caused by limitations and defects in the related art, at least to some extent.

Additional aspects and advantages of the disclosure will set forth in the description below, and will become obvious from the description, or may be in part learned from practice of the present disclosure.

According to the first aspect of an embodiment of the present disclosure, there is provided an electroluminescent device, including a first transparent electrode layer, an electroluminescent layer, a channel layer, a second transparent electrode layer, a dielectric layer, a light absorption layer and a third electrode layer stacked in turn, wherein the light absorption layer can be excited by a light emitted from the electroluminescent layer to generate photocarriers.

In an exemplary embodiment of the present disclosure, the light absorption layer is a quantum dot (QD) layer composed of QDs.

In an exemplary embodiment of the present disclosure, a light-emitting wavelength of the QDs included in the QD layer is greater than a light-emitting wavelength of the electroluminescent layer.

In an exemplary embodiment of the present disclosure, the electroluminescent device further includes:

a hole barrier layer that is located between the QD layer and the third electrode layer.

In an exemplary embodiment of the present disclosure, the first transparent electrode layer is electrically connected to an anode of a first power supply, the third electrode layer is electrically connected to an anode of a second power supply, and the second transparent electrode layer is electrically connected to a cathode of the first power supply and a cathode of the second power supply.

In an exemplary embodiment of the present disclosure, wherein the QDs in the QD layer have a particle diameter of 5-20 nm, and the QD layer has a thickness of 5-500 nm.

In an exemplary embodiment of the present disclosure, the third electrode layer is a transparent electrode layer.

In an exemplary embodiment of the present disclosure, the QD layer includes one or more of a group II-VI elements core-shell structure, a group III-V elements core-shell structure, a transition metal doped nanocrystal, a rare earth metal doped nanocrystal, or a lead-based perovskite nanocrystal.

According to the second aspect of the embodiment of the present disclosure, there is provided with a manufacturing method for an electroluminescent device, wherein the manufacturing method includes:

forming a first transparent electrode layer, an electroluminescent layer, a channel layer, a second transparent electrode layer, a dielectric layer, a light absorption layer and a third electrode layer stacked in turn, wherein the light absorption layer can be excited by a light emitted from the electroluminescent layer to generate photocarriers.

In an exemplary embodiment of the present application, the light absorption layer is a QD layer composed of QDs.

In an exemplary embodiment of the present application, a light-emitting wavelength of the QDs included in the QD layer is greater than a light-emitting wavelength of the electroluminescent layer.

In an exemplary embodiment of the present application, the QDs in the QD layer has a particle diameter of 5-20 nm, and the QD layer has a thickness of 5-500 nm.

In an exemplary embodiment of the present application, the QD layer includes one or more of a group II-VI elements core-shell structure, a group III-V elements core-shell structure, a transition metal doped nanocrystal, a rare earth metal doped nanocrystal, or a lead-based perovskite nanocrystal.

In an exemplary embodiment of the present application, the third electrode layer is a transparent electrode layer.

According to the third aspect of the present disclosure, there is provided with a display panel, including the electroluminescent device according to any one of the preceding claims.

In an exemplary embodiment of the present application, the display panel includes a transparent substrate, a light-emitting layer, and an encapsulating layer stacked in turn, wherein the light-emitting layer includes the electroluminescent device having a first color electroluminescent layer, the electroluminescent device having a second color electroluminescent layer, and the electroluminescent layer having a third color electroluminescent layer arranged in an array.

In an exemplary embodiment of the present application, the display panel includes a transparent substrate, a light-emitting layer, and an encapsulating layer stacked in turn, wherein the light-emitting layer includes the electroluminescent device having a white electroluminescent layer, and a color film layer includes a first color filter area, a second color filter area and a third color filter area arranged in an array.

The technical solutions as provided in the embodiments of the present disclosure may include following advantageous effects:

In one embodiment of the present disclosure, by means of the display panel, the electroluminescent device and the manufacturing method thereof, by arranging the light absorption layer in the electroluminescent device, the light absorption layer including a semiconductor nanomaterial that can be excited by light emitted from the electroluminescent layer in the electroluminescent device so as to generate photocarriers. In this way, on one hand, the electroluminescent device may generate photocarriers by self-luminous and may be injected into the electroluminescent layer to achieve light emission effects, thereby reducing power consumption of the panel; on the other hand, the electroluminescent device does not need to be attached by a circular polarizer and quarter-wave plate, which reduces the cost and allows products such as display panels to meet requirement for ultra-thinning and miniaturization.

It should be understood that both foregoing general description and following detailed description are merely exemplary and explanatory but are not limited to the present disclosures.

BRIEF DESCRIPTION OF THE DRAWINGS

The accompanying drawings, which are incorporated in and constitute a part of the present description, illustrate embodiments of the present disclosure, and together with the description serve to explain the principle of the present disclosure. Obviously, the drawings in the following description are provided to merely illustrate some of the embodiments of the present disclosure. For those ordinary skilled in the art, other drawings may also be obtained according to these drawings without any creative work.

DETAILED DESCRIPTION

Figure 1:
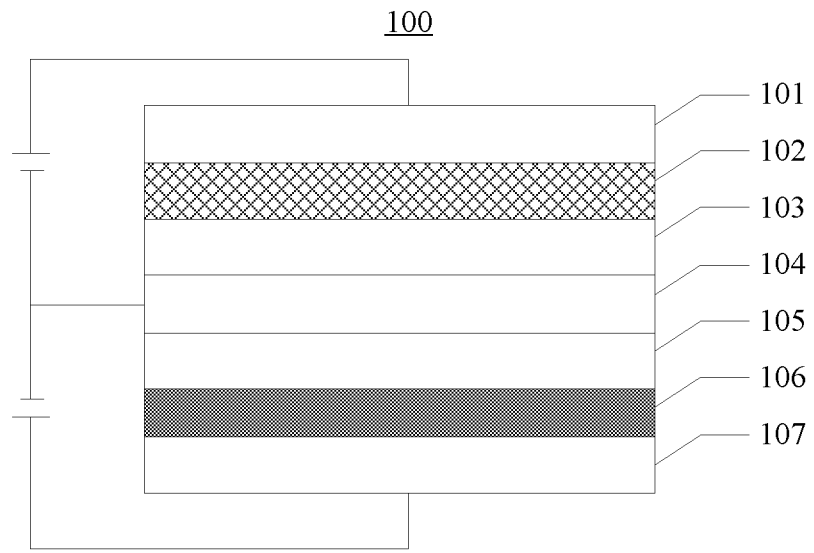
FIG. 1 is a schematic structural view showing an electroluminescent device according to an exemplary embodiment of the present disclosure.

Now, the exemplary embodiments will be described more fully with reference to the accompany drawings. However, the exemplary embodiments can be implemented in various forms and should not be construed as limiting to the embodiments set forth herein. Instead, these embodiments are provided so that the present disclosure will be thorough and complete, and the concept of the exemplary embodiment will fully conveyed to those skilled in the art. The described features, structures or characteristics may be incorporated into one or more implementations in any suitable manner.

In addition, the figures of the present disclosure are only illustrative, but not necessarily to scale. In the drawings, the same reference numbers will be used throughout the drawings to refer to the same or like parts.

In the present exemplary embodiment, there is provided with an electroluminescent device, referring to FIG. 1, the electroluminescent device 100 may include a first transparent electrode layer 101, an electroluminescent layer 102, and a channel layer 103, a second transparent electrode layer 104, a dielectric layer 105, a light absorption layer 106, and a third electrode layer 107 that are stacked in turn, wherein the light absorption layer 106 includes a semiconductor nanomaterial that can be excited by a light emitted by the electroluminescent layer 102 to generate photocarriers.

The electroluminescent device in the present exemplary embodiment, on one hand, may generate photocarriers by self-luminous and may be injected into the electroluminescent layer 102 to achieve light emission effects so that power consumption of a panel can be reduced. On the other hand, the electroluminescent device does not need to be attached by a circular polarizer and a quarter-wave plate, which reduces cost and enable products such as display panels to meet the requirements for ultra-thinning and miniaturization. Hereinafter, various parts of the electroluminescent device 100 will be described in more detail.

In the present exemplary embodiment, the first transparent electrode layer 101 may be a drain transparent electrode layer, i.e., a drain electrode layer. The first transparent electrode layer 101 may be formed by doping, for example, indium tin oxide (ITO), indium zinc oxide (IZO), or Graphene with two or more of alloys such as Li, Al, Ag, Mg, Au, Mo, Cr, Ti, and Cu. The first transparent electrode layer 101 may have a thickness of 10 to 2000 nm. The electroluminescent layer 102 may be made of organic light-emitting diodes fluorescent or phosphorescent light-emitting materials, such as a fine organic material DCM, a green light material C-545MT, a blue light material TBPSF. As an example, the channel layer 103 may be formed of a footballene C60 and the like. The channel layer 103 may have a thickness of 10 to 2000 nm. The second transparent electrode layer 104 may be a source transparent electrode layer, i.e., a source electrode layer. The second transparent electrode layer 104 may be formed by recombining two or more of ITO, IZO, Graphene and the like. The second transparent electrode layer 104 may have a thickness of 2 to 200 nm. The second transparent electrode layer 104 may also be a quasi-continuous structure or have a hollow structure. As an example, the hollow structure may be an array of approximately circular, square or stripe shape, or a porous structure formed by a nanowire/tube thin film. The hollow structure has a diameter or a long edge of 10 nm to 2000 nm. The dielectric layer 105 may be formed by recombining two or more of, for example, organic materials such as $SiN_x$, $SiO_x$, or hafnium oxide $HfO_2$. The dielectric layer 105 may have a thickness of 10 to 2000 nm. The third electrode layer may be an opaque electrode layer or a transparent electrode layer. In one embodiment, the third electrode layer 107 may be a gate transparent electrode layer, i.e., a gate electrode layer. The third electrode layer 107 may be formed by recombining two or more of, for example, ITO, IZO, Graphene or the like. The third electrode layer 107 may have a thickness of 1-100 nm.

Figure 2:
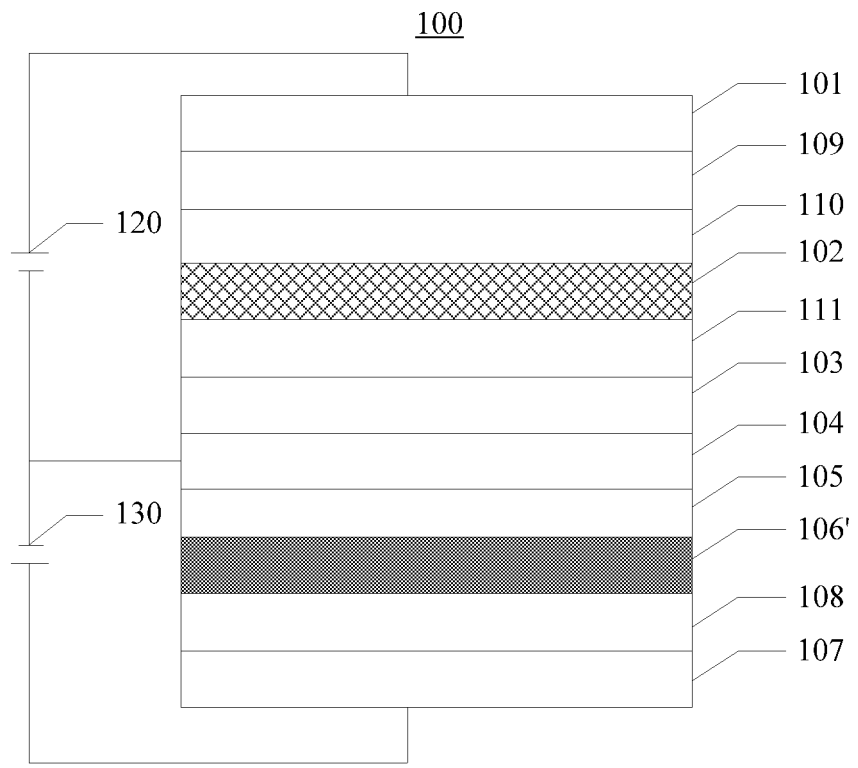
FIG. 2 is a schematic structural view showing another electroluminescent device according to an exemplary embodiment of the present disclosure.

Referring to FIG. 2, the semiconductor nanomaterial may be a quantum dot (QD). The light absorption layer 106 is a QD layer 106' composed of the QDs. The QD is a semiconductor nanostructure that can allow conduction band electrons, valence band holes, and excitons to be bound in three spatial directions, in which movement of the internal electrons in all directions is limited, so the quantum confinement effect is extremely noticeable. QD may also be called a nanocrystal, since electrons and holes are confined by the quantum, the continuous energy band structure becomes a discrete energy level structure with molecular characteristics, and thus can emit fluorescent light after being excited. The QD layer 106' can excite carriers such as holes and electrons, by the light emitted from the electroluminescent layer 102. The photo-generated holes and electrons may be injected into the electroluminescent layer 102 to achieve light emission, so that the power consumption of the panel can be reduced. The light-emitting wavelength of the QDs included in the QD layer 106' is greater than the wavelength of the light emitted from the electroluminescent layer 102, and the light emitted from the electroluminescent layer 102 can excite the QD layer 106' to emit light.

In one exemplary embodiment, the QD in the QD layer 106' may have a particle diameter of 5 to 20 nm, such as 5 nm, 10 nm, 15 nm, or 20 nm. The QD layer 106' may have a thickness of 5-500 nm, such as 5 nm, 30 nm, 50 nm, 100 nm, 300 nm, or 500 nm. A person skilled in the art may specifically select the particle diameter of the QD or the thickness of the QD layer 106' as desired, which is not particularly limited.

In a further exemplary embodiment, the QD layer 106' may include one or more of a group II-VI elements core-shell structure, a group III-V elements core-shell structure, a transition metal doped nanocrystal, a rare earth metal doped nanocrystal, or a lead-based perovskite nanocrystal. The core-shell structure is an ordered assembly structure formed in a manner that one material wraps the other material by means of chemical bonds or other acting forces. A core-shell particle has a core-shell structure. The core-shell particle is a nano-sized ordered assembly structure formed in a manner that one nano-material wraps the other nano-material through chemical bonds or other acting forces. The wrapping technology changes surface charges, functional groups and reaction characteristics of the inner core by trimming surface properties of the inner core microparticles, thereby improving stability and dispersity of the inner core, and doping and surface plasmon resonance technique and the like can enhance light emission of the core-shell microparticles. In the present exemplary embodiment, the QD in the QD layer 106' may adopt a group II-VI or a group III-V elements core-shell structure; or the QD layer 106' may also form a film layer, for example the transition metal doped nanocrystal such as Cu, or the rare earth metal doped nanocrystal such as Ce, by using the transition metal or the rare earth metal doped nanocrystal; or the QD layer 106' may also form a film layer by using the lead-based perovskite nanocrystal, of course, by doping other transition group metals or rare earth metals, which is not limited in the present exemplary embodiment. Through the above-mentioned QD layer 106' with the microstructures and formed by doping with corresponding materials, stability of the QD layer 106' can be improved, light emission can be enhanced to generate more photocarriers, and furthermore, the electroluminescent device can reduce the power consumption of the panel.

In order to enable the QD layer 106' to be excited more efficiently by the light emitted from the electroluminescent layer 102 to generate carriers, in one exemplary embodiment, the electroluminescent layer 102 may include a blue electroluminescent layer, and correspondingly, the QD layer 106' includes a green light QD or a yellow light QD having a light-emitting wavelength longer than that of the blue electroluminescent layer; and/or the electroluminescent layer 102 may include a green electroluminescent layer, and correspondingly, the QD layer 106' includes the yellow light QD or the green light QD having a longer light-emitting wavelength; and/or the electroluminescent layer 102 may include a red electroluminescent layer, and correspondingly, the QD layer 106' includes a near-infrared light QD having a longer light-emitting wavelength. That is, the light-emitting wavelength of the QD included in the QD layer 106' is greater than the wavelength of the light emitted from the electroluminescent layer 102, and the light emitted from the electroluminescent layer 102 can excite the QD layer 106' to emit light.

That is to say, in the QD layer 106', the QD corresponding to the blue electroluminescent layer, such as the green (G) or the yellow (Y) QD, the QD corresponding to the green electroluminescent layer, such as the yellow (Y), or the red (R) QD, or the QD corresponding to the red electroluminescent layer, such as the near-infrared light QD may be separately provided. Of course, a hybrid QD of any two or three combination among the above three types of QDs may be simultaneously provided. In this way, by providing different QDs respectively corresponding to the blue, green, and red light-emitting layers from the electroluminescent layer 102 in the QD layer 106', the QD layer 106' can match with a white light spectrum and absorb the light emitted from the electroluminescent layer 102, such that the QD is more easily excited, and thereby the QD layer 106' can be excited more effectively by the light emitted from the electroluminescent layer 102 to generate carriers.

Referring to FIG. 2, in one exemplary embodiment, the electroluminescent device 100 may further include a hole barrier layer 108 that is disposed between the QD layer 106' and the third electrode layer 107. As an example, the hole barrier layer 108 may be made of materials such as zinc oxide (ZnO), titanium dioxide ($TiO_2$), tin oxide ($SnO_2$). The hole barrier layer 108 may have a thickness of 10 to 200 nm. The hole barrier layer 108 plays a role of blocking holes so that the hole generated by the QD layer 106' is located in the hole barrier layer 108 without entering the third electrode layer 107, so as to generate more electronics on one side of the dielectric layer 105, and furthermore, to improve the light-emitting efficiency to some extent and further reduce the power consumption of the panel.

Referring to FIG. 2, in one exemplary embodiment, the electroluminescent device 100 may further include a hole-injection layer 109 and a hole-transporting layer 110. The hole-injection layer 109 is disposed between the first transparent electrode layer 101 and the electroluminescent layer 102. As an example, the hole-injection layer 109 may be formed by recombining two of, for example, LG101, molybdenum oxide (MoO$_x$), C60 or the like. The hole-injection layer 109 may have a thickness of 1-200 nm. The hole-transporting layer 110 is disposed between the hole-injection layer 109 and the electroluminescent layer 102. As an example, the hole-transporting layer 110 may be formed by recombining two of, for example, poly(9,9-dioctylfluorene-co-N-(4-butylphenyl) diphenylamine) TFB, poly(9-vinyl-carbazole) PVK, N,N'-diphenyl-N,N'-(1-naphthyl)-1,1'-biphenyl-4,4'-diamine NPB, 4,4'-bis(N-carbazole)-1,1'-biphenyl CBP, the copper phthalocyanine CuPc, or the like. The hole-transporting layer 110 may have a thickness of 1 to 200 nm. The hole-injection layer 109 and the hole-transporting layer 110 facilitate the holes generated in the first transparent electrode layer 101 to be efficiently transported and injected into the electroluminescent layer 102, which can improve the light-emitting efficiency to some extent.

Referring to FIG. 2, in one exemplary embodiment, the electroluminescent device 100 may further include an electron-transporting layer 111 that is disposed between the channel layer 103 and the electroluminescent layer 102. As an example, the electron-transporting layer 111 may be formed by recombining two of, for example, tris(8-hydroxy-quinoline aluminum) Alq3, 1,3,5-tris(1-phenyl-1H-benzimidazol-2-yl)benzene TPBi or the like. And the electron-transporting layer 111 may have a thickness of 1 to 200 nm. The electron-transporting layer 111 may facilitate for transporting the electrons generated by the second electrode layer 104 and the electrons on one side of the dielectric layer 105 closely next to the second electrode layer 104 to the electroluminescent layer 102, so as to improve the light-emitting efficiency. Wherein, the electrons on one side of the dielectric layer 105 are induced by the holes generated by the light excitation of the QD layer 106' on the other side of the dielectric layer 105.

As an example, respective layers in the electroluminescent device 100 as above-mentioned in FIG. 1 or FIG. 2 may be formed through one or more mature processes in printing, transfer printing, evaporation (such as vacuum evaporation or electron beam evaporation), magnetron sputtering, and atomic layer deposition.

Referring to FIG. 2, in one exemplary embodiment, the first transparent electrode layer 101 is electrically connected to an anode of the first power supply 120, the third electrode layer 107 is electrically connected to an anode of the second power supply 130, and the second transparent electrode layer 104 is electrically connected to a cathode of the first power supply 120 and a cathode of the second power supply 130.

As an example, the first transparent electrode layer 101 may be a drain transparent electrode layer (i.e., a drain electrode layer, also called as a drain D). The second transparent electrode layer 104 may be a source transparent electrode layer, (i.e., a source electrode layer, also called as a source S). The third electrode layer 107 may be a gate transparent electrode layer (i.e., a gate electrode layer, also called as a gate G). In this example, the drain D of the electroluminescent device is electrically connected to the anode of the first power supply 120, the gate G is electrically connected to the anode of the second power supply 130, and the source S is electrically connected to the cathode of the first power supply 120 and the cathode of the second power supply 130. When a voltage between the gate G and the source S (corresponding to a voltage of the second power supply 130), namely a $V_{GS}$ forward bias voltage is 0 to 20 V, for example, the holes generated by the QD layer 106' due to the light excitation accumulate at an interface of the QD layer 106'/dielectric layer 105, accordingly the corresponding electrons accumulated at the interface of the dielectric layer 105/the second transparent electrode layer 104/channel layer 103 are collected via the channel layer 103 and may be injected into the electroluminescent layer through the electron-transporting layer 111. The electroluminescent layer 102 may be, for example, an OLED organic light-emitting layer or a QLED QD light-emitting layer. In this case, the electrons generated from the QD layer 106' due to light excitation are finally injected into the electroluminescent layer 102, to reduce the $V_{GS}$ voltage, that is, the power consumption of the panel can be reduced by the QD layer 106' absorbing the light emitted by the electroluminescent device itself.

Figure 3:
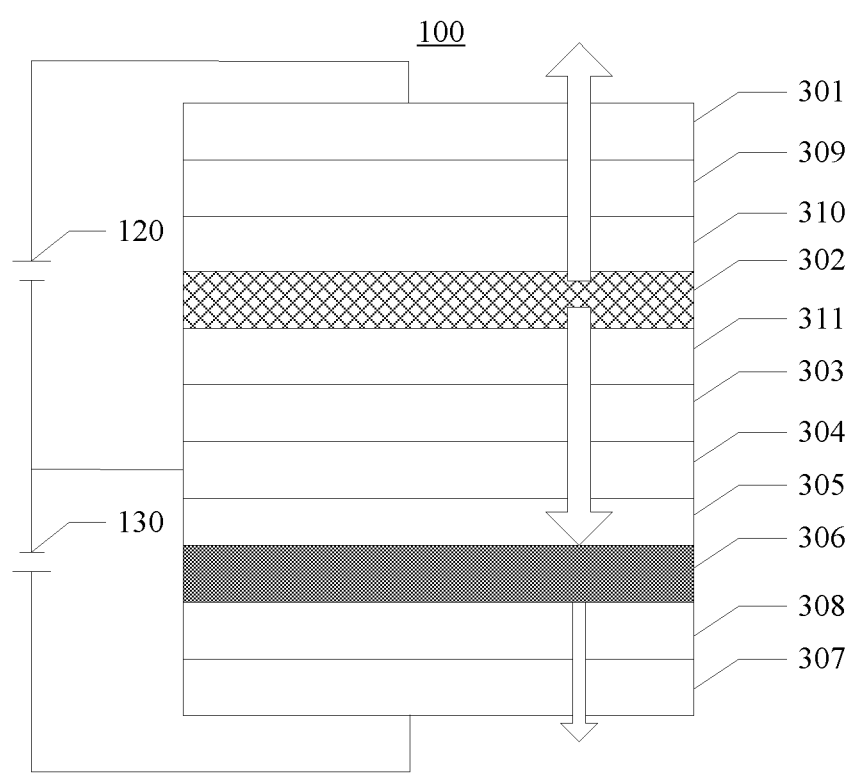
FIG. 3 is a schematic structural view showing a further electroluminescent device according to an exemplary embodiment of the present disclosure.

Referring to FIG. 3, FIG. 3 schematically shows a schematic view of a structure of an electroluminescent device. The electroluminescent device may include layers stacked in turn from bottom to top, i.e., a gate transparent electrode 307, a hole barrier layer (HBL) 308, QD layer (QDs) 306, a dielectric layer 305, a source transparent electrode 304, a vertical channel layer 303, an electron-transporting layer (ETL) 311, an emissive layer (EML) 302, a hole-transporting layer (HTL) 310, a hole-injection layer (HIL) 309, and a drain transparent electrode 301.

Wherein, the source S, the gate and the drain D are all transparent electrodes. The drain transparent electrode may be considered as an OLED anode, and the source transparent electrode may be considered as an OLED cathode. In the electroluminescent device of this example, the dielectric layer is provided between the source transparent electrode and the gate transparent electrode, a QD layer is disposed between the dielectric layer and the gate transparent electrode as the photo-detection layer. The material of the QD layer corresponds to a luminescent color of, for example the OLED light-emitting layer EML. For example, the blue light-emitting layer in the EML corresponds to G or Y QD, the green light-emitting layer corresponds to Y or R QD, and the red light-emitting layer corresponds to near-infrared QD. Thereby, the QD layer may absorb light emitted by the OLED EML itself, and generate photo-generated electrons and holes, i.e., a photocurrent. In addition, a hole barrier layer HBL is provided between the gate transparent electrode and the QD layer. Under the $V_{GS}$ forward bias voltage of, for example 0~20V, photo-generated holes accumulate at the interface of QDs/dielectric, and accordingly, electrons are accumulated at the interface of dielectric/source/channel, and are collected by the vertical channel layer and injected into the light-emitting layer EML so as to reduce $V_{GS}$ voltage, that is, the power consumption of the panel can be reduced by the QD absorbing the light emitted by the electroluminescent device itself.

In the electroluminescent device of this example, by absorbing the light emitted from the self-light-emitting layer EML with QDs in the QD layer, the generated photocarriers after being gained and amplified are injected into the electroluminescent device.

Figure 4:
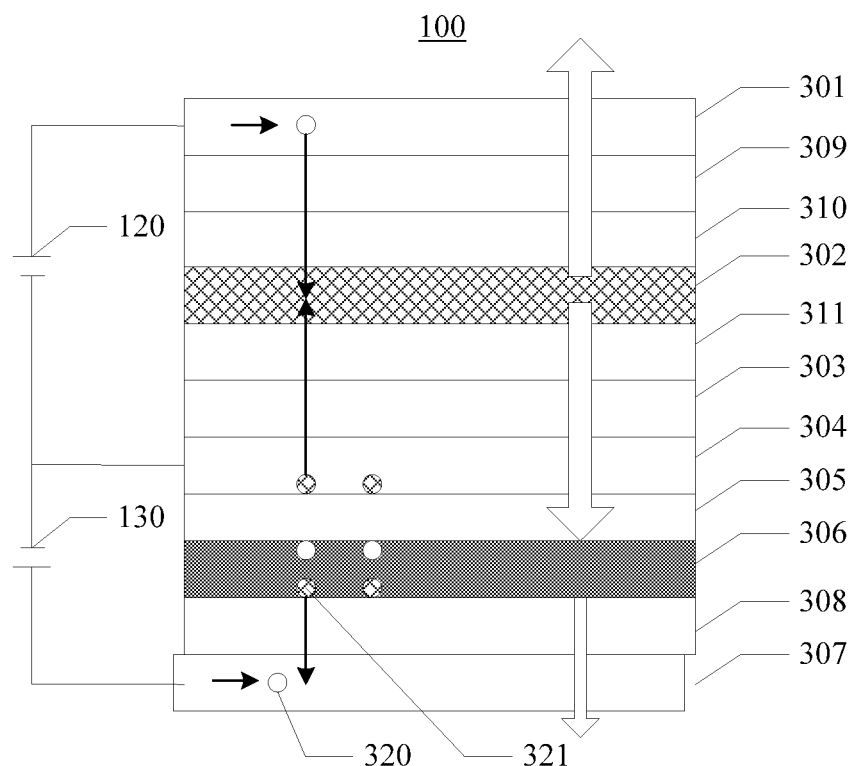
FIG. 4 schematically shows a working principle of the electroluminescent device according to the exemplary embodiment of the present disclosure.

Referring to FIG. 4, a working principle of the electroluminescent device is presented as follows:

Firstly, Detection Unit (QDs/HBL)

In this section, the QDs in the QD layer 306 absorb light emitted from the light-emitting layer, photo-generated charge separation is generated, the electrons 321 return to the gate transparent anode 307, and the holes 320 accumulate at an interface of the QDs/channel.

Secondly, Gain Unit (Gate-HBL-QDs-Dielectric-Source-Channel)

In this section, under the voltage $V_{GS}$, the electrons 321 on the side of the dielectric layer 305 corresponding to the photo-generated holes 320 are accumulated at the interface of the dielectric/source/channel, i.e., the electronic gain, it results in that an energy band of a vertical channel layer is bent and becomes thinner, subsequently the electrons access into the vertical channel layer 303, and are collected and stored and then injected into the light-emitting layer EML of the electroluminescent device.

Thirdly, Light-Emitting Unit (ETL-EML-HTL-HIL-Drain)

In this section, under a voltage VDS, holes generated by the drain transparent electrode 301 are injected into the EML layer 302 and recombined with the electrons to emit light. The light emitted upwardly is used for displaying of, for example a display panel, and the light emitted downwardly is used for exciting the QDs in the QD layer 306 to generate photocarriers.

In the present exemplary embodiment, there is further provided with a method for manufacturing an electroluminescent device, including following steps of forming a first transparent electrode layer, an electroluminescent layer, a channel layer, a second transparent electrode layer, a dielectric layer, a light absorption layer and a third electrode layer, which are stacked in turn. Wherein the light absorption layer includes a semiconductor nano-material of carriers enable to be excited by light emitted from the organic light-emitting layer.

According to the electroluminescent device manufactured by the manufacturing method as above described, on the one hand, photocarriers may be generated due to self-luminescence characteristics and may be injected into the electroluminescent layer to achieve light emission effects, thereby reducing power consumption of the panel; on the other hand, the electroluminescent device does not need to be attached by a circular polarizer and quarter-wave plate, which may reduce the cost and allow products such as display panels to meet the requirement for ultra-thinning and miniaturization.

Hereinafter, the foresaid manufacturing method in the present exemplary embodiment will be described in more detail.

As shown in FIG. 1, the exemplary electroluminescent device 100 manufactured by the above manufacturing method may include a first transparent electrode layer 101, an electroluminescent layer 102, a channel layer 103, a second transparent electrode layer 104, a dielectric layer 105, a light absorption layer 106, and a third electrode that are stacked in turn. Wherein the light absorption layer 106 includes a semiconductor nanomaterial of the carriers to be excited by the light emitted from the electroluminescent layer 102.

As an example, the first transparent electrode layer 101 may be a drain transparent electrode layer, i.e., a drain electrode layer. The first transparent electrode layer 101 may be formed by doping, for example, indium tin oxide (ITO), indium zinc oxide (IZO), or Graphene with two or more of alloys such as Li, Al, Ag, Mg, Au, Mo, Cr, Ti, and Cu. The first transparent electrode layer 101 may have a thickness of 10 to 2000 nm. The electroluminescent layer 102 may be made of organic light-emitting diodes fluorescent or phosphorescent light-emitting materials, such as a red light material DCM, a green light material C-545MT, a blue light material TBPSF. As an example, the channel layer 103 may be formed of a footballene C60 and the like. The channel layer 103 may have a thickness of 10 to 2000 nm. The second transparent electrode layer 104 may be a source transparent electrode layer, i.e., a source electrode layer. The second transparent electrode layer 104 may be formed by recombining two or more of ITO, IZO, Graphene and the like. The second transparent electrode layer 104 may have a thickness of 2 to 200 nm. The second transparent electrode layer 104 may also be a quasi-continuous structure or have a hollow structure. As an example, the hollow structure may be an array of approximately circular, square or stripe shape, or a porous structure formed by a nanowire/tube thin film. The hollow structure has a diameter or a long edge of 10 nm to 2000 nm. The directive 105 may be formed by recombining two or more of, for example, organic materials such as $SiN_x$, $SiO_x$, or hafnium oxide $HfO_2$. The directive 105 may have a thickness of 10 to 2000 nm. The third electrode layer may be an opaque electrode layer or a transparent electrode layer. In one embodiment, the third electrode layer 107 may be a gate transparent electrode layer, i.e., a gate electrode layer. The third electrode layer 107 may be formed by recombining two or more of, for example, ITO, IZO, Graphene or the like. And The third electrode layer 107 may have a thickness of 1-100 nm.

Referring to FIG. 2, the semiconductor nanomaterial may be a quantum dot (QD). The light absorption layer 106 is a QD layer 106' composed of the QDs. The QD is a semiconductor nanostructure that can allow conduction band electrons, valence band holes, and excitons to be bound in three spatial directions, in which movement of the internal electrons in all directions is limited, so the quantum confinement effect is extremely noticeable. QD may also be called a nanocrystal, since electrons and holes are confined by the quantum, the continuous energy band structure becomes a discrete energy level structure with molecular characteristics, and thus can emit fluorescent light after being excited. The QD layer 106' can excite carriers such as holes and electrons, by the light emitted from the electroluminescent layer 102. The photo-generated holes and electrons may be injected into the electroluminescent layer 102 to achieve light emission, so that the power consumption of the panel can be reduced.

In one exemplary embodiment, the QD in the formed QD layer 106' may have a particle diameter of 5 to 20 nm, such as 5 nm, 10 nm, 15 nm, or 20 nm. The formed QD layer 106' may have a thickness of 5-500 nm, such as 5 nm, 30 nm, 50 nm, 100 nm, 300 nm, or 500 nm. A person skilled in the art may specifically select the particle diameter of the QD or the thickness of the QD layer 106' as desired, which is not particularly limited.

In a further exemplary embodiment, the QD layer 106' may include one or more of a group II-VI elements core-shell structure, a group III-V elements core-shell structure, a transition metal doped nanocrystal, a rare earth metal doped nanocrystal, or a lead-based perovskite nanocrystal. The core-shell structure is an ordered assembly structure formed in a manner that one material wraps the other material by means of chemical bonds or other acting forces. A core-shell particle has a core-shell structure. The core-shell particle is a nano-sized ordered assembly structure formed in a manner that one nano-material wraps the other nano-material through chemical bonds or other acting forces. The wrapping technology changes surface charges, functional groups and reaction characteristics of the inner core by trimming surface properties of the inner core microparticles, thereby improving stability and dispersity of the inner core, and doping and surface plasmon resonance technique and the like can enhance light emission of the core-shell microparticles. In the present exemplary embodiment, the QDs in the QD layer 106' may adopt a group II-VI or a group III-V elements core-shell structure; or the QD layer 106' may also form a film layer, for example the transition metal doped nanocrystal such as Cu, or the rare earth metal doped nanocrystal such as Ce, by using the transition metal or the rare earth metal doped nanocrystal; or the QD layer 106' may also form a film layer by using the lead-based perovskite nanocrystal, of course, by doping other transition group metals or rare earth metals, which is not limited thereto. Through the above-mentioned QD layer 106' with the microstructures and formed by doping with corresponding materials, stability of the QD layer 106' can be improved, light emission can be enhanced to generate more photocarriers, and furthermore, the electroluminescent device can reduce the power consumption of the panel.

In order to enable the QD layer 106' to be excited more efficiently by the light emitted from the electroluminescent layer 102 to generate carriers, in one exemplary embodiment, the formed electroluminescent layer 102 may include a blue electroluminescent layer, and correspondingly, the QD layer 106' includes a green light QD or a yellow light QD having a light-emitting wavelength longer than that of the blue electroluminescent layer; and/or the electroluminescent layer 102 may include a green electroluminescent layer, and correspondingly, the QD layer 106' includes the yellow light QD or the green light QD having a longer light-emitting wavelength; and/or the electroluminescent layer 102 may include a red electroluminescent layer, and correspondingly, the QD layer 106' includes a near-infrared light QD having a longer light-emitting wavelength. That is to say, in the QD layer 106', the QD corresponding to the blue electroluminescent layer, such as the green (G) or the yellow (Y) QD, the QD corresponding to the green electroluminescent layer, such as the yellow (Y) or the red (R) QD, or the QD corresponding to the red electroluminescent layer, such as the near-infrared light QD may be separately provided. Of course, a hybrid QD of any two or three combination among the above three types of QDs may be simultaneously provided. That is, the light-emitting wavelength of the QD included in the QD layer 106' is greater than the wavelength of the light emitted from the electroluminescent layer 102, and the light emitted from the electroluminescent layer can excite the QD layer to emit light. In this way, by providing different QDs respectively corresponding to the blue, green, and red light-emitting layers from the electroluminescent layer 102 in the QD layer 106', the QD layer 106' can match with a white light spectrum and absorb the light emitted from the electroluminescent layer 102 so that the QD is more easily excited, and thereby the QD layer 106' can be excited more effectively by the light emitted from the electroluminescent layer 102 to generate carriers.

Referring to FIG. 2, the exemplary electroluminescent device 100 manufactured by the aforesaid manufacturing method may further include a hole barrier layer 108 that is disposed between the QD layer 106' and the third electrode layer 107. As an example, the hole barrier layer 108 may be made of materials such as zinc oxide (ZnO), titanium dioxide ($TiO_2$), tin oxide ($SnO_2$). The hole barrier layer 108 may have a thickness of 10 to 200 nm. The hole barrier layer 108 plays a role of blocking holes, so that the hole generated by the QD layer 106' is located in the hole barrier layer 108 without entering the third electrode layer 107 to facilitate for generating more electronics on one side of the directive 105, and furthermore, can improve a light-emitting efficiency to some extent and further reduce the power consumption of the panel.

Referring to FIG. 2, the exemplary electroluminescent device 100 manufactured by the aforesaid manufacturing method may further include a hole-injection layer 109 and a hole-transporting layer 110. The hole-injection layer 109 is disposed between the first transparent electrode layer 101 and the electroluminescent layer 102. As an example, the hole-injection layer 109 may be formed by recombining two of, for example, LG101, molybdenum oxide ($MoO_x$), C60 or the like. The hole-injection layer 109 may have a thickness of 1-200 nm. The hole-transporting layer 110 is disposed between the hole-injection layer 109 and the electroluminescent layer 102. As an example, the hole-transporting layer 110 may be formed by recombining two of, for example, poly(9,9-dioctylfluorene-co-N-(4-butylphenyl) diphenyl amine) TFB, poly(9-vinylcarbazole) PVK, N,N'-diphenyl-N,N'-(1-naphthyl)-1,1'-biphenyl-4,4'-diamine NPB, 4,4'-bis(N-carbazole)-1,1'-biphenyl CBP, the copper phthalocyanine CuPc, or the like. The hole-transporting layer 110 may have a thickness of 1 to 200 nm. The hole-injection layer 109 and the hole-transporting layer 110 facilitate the holes generated in the first transparent electrode layer 101 to be efficiently transported and injected into the electroluminescent layer 102, which can improve the light-emitting efficiency to some extent.

Referring to FIG. 2, the exemplary electroluminescent device 100 manufactured by the aforesaid manufacturing method may further include an electron-transporting layer 111 that is disposed between the channel layer 103 and the electroluminescent layer 102. As an example, the electron-transporting layer 111 may be formed by recombining two of, for example, tris(8-hydroxyquinoline aluminum) Alq3, 1,3,5-tris(1-phenyl-1H-benzimidazol-2-yl)benzene TPBi or the like. And the electron-transporting layer 111 may have a thickness of 1 to 200 nm. The electron-transporting layer 111 may facilitate for transporting the electrons generated by the second electrode layer 104 and the electrons on one side of the directive 105 closely next to the second electrode layer 104 to the electroluminescent layer 102, so as to improve the light-emitting efficiency. Wherein, the electrons on one side of the directive 105 are induced by the holes generated by the light excitation of the QD layer 106' on the other side of the directive 105.

As an example, the first transparent electrode layer 101, the hole-injection layer 109, the hole-transporting layer 110, the electroluminescent layer 102, the electron-transporting layer 111, the channel layer 103, the second transparent electrode layer 104, the directive 105, the QD layer 106', the hole-barrier layer 108 and the third electrode layer 107 may be formed through one or more mature processes in printing, transfer printing, evaporation (such as vacuum evaporation or electron beam evaporation), magnetron sputtering, and atomic layer deposition in the aforesaid manufacturing method. The specific contents involving the respective processes may take the prior art for reference, herein will be omitted.

Referring to FIG. 2, in one exemplary embodiment, the first transparent electrode layer 101 formed by the aforesaid manufacturing method is electrically connected to an anode of the first power supply 120, the third electrode layer 107 as formed is electrically connected to an anode of the second power supply 130, and the second transparent electrode layer 104 as formed is electrically connected to a cathode of the first power supply 120 and a cathode of the second power supply 130.

As an example, the first transparent electrode layer 101 may be a drain transparent electrode layer (i.e., a drain electrode layer, also called as a drain D). The second transparent electrode layer 104 may be a source transparent electrode layer, (i.e., a source electrode layer, also called as a source S). The third electrode layer 107 may be a gate transparent electrode layer (i.e., a gate electrode layer, also called as a gate G). In this example, the drain D of the electroluminescent device is electrically connected to the anode of the first power supply 120, the gate G is electrically connected to the anode of the second power supply 130, and the source S is electrically connected to the cathode of the first power supply 120 and the cathode of the second power supply 130. When a voltage between the gate G and the source S (corresponding to a voltage of the second power supply 130), namely a $V_{GS}$ forward bias voltage is 0 to 20 V, for example, the holes generated by the QD layer 106' due to the light excitation accumulate at an interface of the QD layer 106'/directive 105, accordingly the corresponding electrons accumulated at the interface of the directive 105/the second transparent electrode layer 104/channel layer 103 are collected via the channel layer 103 and may be injected into the electroluminescent layer through the electron-transporting layer 111. The electroluminescent layer 102 may be, for example, an OLED organic light-emitting layer. In this case, the electrons finally formed by the QD layer 106' due to light excitation are injected into the electroluminescent layer 102, to reduce the $V_{GS}$ voltage, that is, the power consumption of the panel can be reduced by the QD layer 106' absorbing the light emitted by the electroluminescent device itself.

Further, in the present exemplary embodiment, there is also provided with a display panel. The display panel may include the electroluminescent device 100 according to any one of the embodiments as shown in FIG. 1 or FIG. 2. An exemplary description of the display panel is given below.

Figure 5:
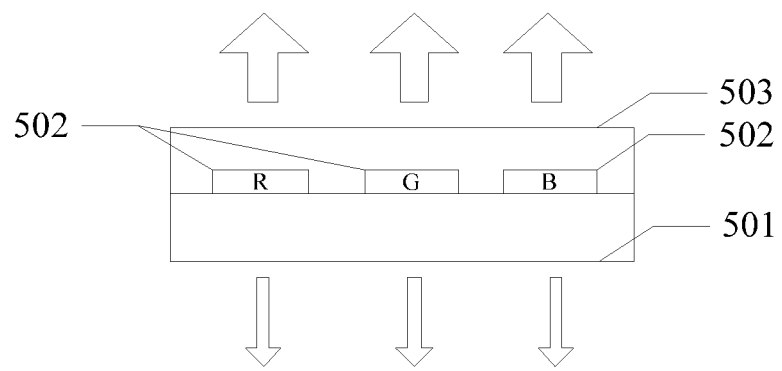
FIG. 5 is a schematic structural view showing a display panel according an exemplary embodiment of the present disclosure.

With reference to the display panel as shown in FIG. 5, the display panel may include a transparent substrate 501, a light-emitting layer 502, and an encapsulating layer 503 stacked in turn.

The light-emitting layer 502 may include an electroluminescent device having a first color (e.g. red R) electroluminescent layer, an electroluminescent device having a second color (e.g. green G) electroluminescent layer, and an electroluminescent layer having a third color (e.g. blue B) electroluminescent layer, which are arranged in an array. As an example, the light-emitting layer 502 may include separated R, B color light-emitting layers, and the encapsulation layer 503 is a transparent encapsulation layer. Specific description of the electroluminescent device may refer to the detailed description in the foregoing embodiments, and thereby may be omitted.

As an example, as shown in FIG. 2, different QDs respectively corresponding to the blue, green, and red light-emitting layers in the electroluminescent layer 102 are disposed in the QD layer 106' in the electroluminescent device in the display panel 500, so that the QD layer 106' is more easily excited, and thereby the QD layer 106' can be more efficiently excited by the light emitted from the electroluminescent layer 102 to generate carriers. Therefore, the electroluminescent device in the display panel may generate photocarriers by self-luminous and the photocarriers may be injected into the electroluminescent layer to achieve light emission effects, so that power consumption of a panel can be reduced. In addition, the electroluminescent device does not need to be attached by a circular polarizer and a quarter-wave plate, which may reduce cost and enable the display panel to meet the requirements for ultra-thinning and miniaturization.

Figure 6:
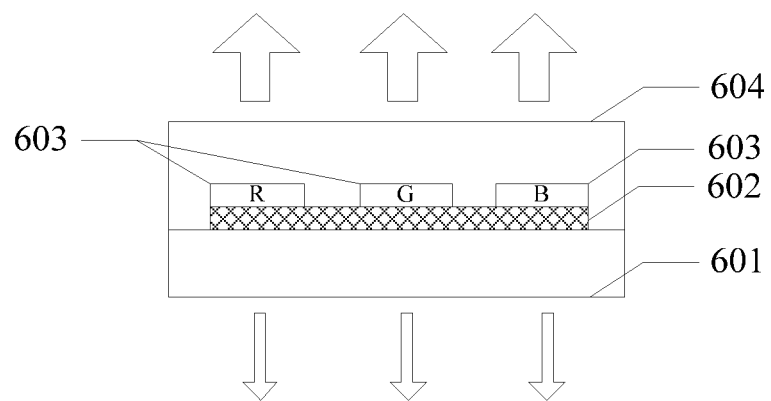
FIG. 6 is a schematic structural view showing another display panel according to an exemplary embodiment of the present disclosure.

With reference to the display panel as shown in FIG. 6, the display panel may include a transparent substrate 601, a light-emitting layer 602, a color film layer 603, and an encapsulation layer 604 stacked in turn.

The light-emitting layer 602 may include the electroluminescent device having a white electroluminescent layer. The color filter layer 603 may include a first color (e.g. red R) filter area, a second color (e.g. green G) filter area, and a third color (e.g. blue B) filter area, which are disposed in an array. The encapsulation layer 604 is a transparent encapsulation layer. Specific description of the electroluminescent device may refer to the detailed description in the foregoing embodiments, and thereby may be omitted.

In the display panel 600, the light-emitting layer 602 includes the electroluminescent device having a white electroluminescent layer, and the color film layer 603 includes R, and B filter areas. The R, G and B color lights are formed by filtering the white light emitted from the electroluminescent device in the light-emitting layer 602 via the color film layer 603 to be emitted from the encapsulation layer 604. The QD layer in the electroluminescent device in the light-emitting layer 602 can be matched to a white light spectrum, and absorb the light emitted itself to generate photocarriers. Therefore, the electroluminescent device in the display panel may generate photocarriers by self-luminous and those photocarriers may be injected into its own electroluminescent layer to achieve light emission effects so that power consumption of the panel can be reduced. In addition, the electroluminescent device does not need to be attached by a circular polarizer and a quarter-wave plate, which reduces cost and enable the display panel to meet the requirements for ultra-thinning and miniaturization.

The foresaid features, structures, or characteristics may be combined in one or more embodiments in any suitable manner, if possible, the characteristics as discussed in each of the embodiments may be interchangeable. Numerous specific details as above described are provided for fully understanding the embodiments of the present disclosure. However, it will be acknowledged for the person skilled in the art that the technical solutions of the present disclosure practiced without one or more of the specific details, or by using other methods, components, materials, etc. may be employed. In other instances, well-known structures, materials, or operations are not shown or described in detail to avoid obscuring various aspects of the present disclosure.

The relativity words, such as "upper" or "lower", as used herein, are directed to describe the relative relationship of the referenced component to another component. These words are used herein for convenience only, for example, according to the direction of the illustrative examples as shown in the figures. It should be appreciated that if the referenced device is inversed upside down, the component indicated as being the "upper" side would become the component on the "lower" side. When one structure is "on" another structure, it is possible to indicate that the one structure is integrally formed on the other structure, or the one structure is "directly" arranged on the other structure, or one structure is "indirectly" formed on the other structure by means of a further structure.

The terms "a", "an", "the", "said" and "at least one", when describing element/constituent/or the like as described and/or shown herein, are used to express the presence of one or more the element/constitute/or the like. The terms "include", "comprise" and "have", as used herein, are intended to be inclusive, and mean there may be additional elements/constituents/or the like other than the listed elements/constituents/or the like. In addition, the words "first", "second", or the like, as used in claims, are meant to indication, but not to limit the object to which they modify.

The person skilled in the art, after consideration of the specification and practice, would easily think of other embodiments of the present disclosure. The present disclosure is directed to cover any variation, use, or adaptive modification, which all comply with the general principle of the present disclosure and include common sense or the customary means in the art. The description and embodiments are merely considered as exemplary examples, and real scope and spirit of the present disclosure are determined by the appended claims.

What is claimed is:

1. An electroluminescent panel, comprising a first transparent electrode layer, an electroluminescent layer, a channel layer, a second transparent electrode layer, a dielectric layer, a light absorption layer and a third electrode layer stacked in turn, wherein the light absorption layer is configured to be excited by a light emitted from the electroluminescent layer to generate photocarriers, and the photocarriers are collected via the channel layer and injected into the electroluminescent layer, the electroluminescent layer comprises at least one of a blue electroluminescent layer having a blue light-emitting wavelength, a green electroluminescent layer having a green light-emitting wavelength and a red electroluminescent layer having a red light-emitting wavelength, the light absorption layer is a quantum dot (QD) layer, if the electroluminescent layer comprises the blue electroluminescent layer, the QD layer comprises green light QDs having a green light-emitting wavelength or yellow light QDs having a yellow light-emitting wavelength, if the electroluminescent layer comprises the green electroluminescent layer, the QD layer comprises yellow light QDs having a yellow light-emitting wavelength, if the electroluminescent layer comprises the red electroluminescent layer, the QD layer comprises near-infrared light QDs having a near-infrared light-emitting wavelength, and the QD layer has a thickness of 5-500 nm.

2. The electroluminescent according to claim 1, further comprising a hole barrier layer that is located between the QD layer and the third electrode layer.

3. The electroluminescent panel according to claim 2, wherein the QDs in the QD layer have a particle diameter of 5-20 nm.

4. The electroluminescent panel according to claim 1, wherein the first transparent electrode layer is electrically connected to an anode of a first power supply, the third electrode layer is electrically connected to an anode of a second power supply, and the second transparent electrode layer is electrically connected to a cathode of the first power supply and a cathode of the second power supply.

5. The electroluminescent panel according to claim 1, wherein the QDs in the QD layer have a particle diameter of 5-20 nm.

6. The electroluminescent panel according to claim 5, wherein the QD layer comprises one or more of a group II-VI elements core-shell structure, a group III-V elements core-shell structure, a transition metal doped nanocrystal, a rare earth metal doped nanocrystal, or a lead-based perovskite nanocrystal.

7. The electroluminescent panel according to claim 1, wherein the third electrode layer is a transparent electrode layer.

8. A display panel, comprising the electroluminescent panel according to claim 1.

9. The display panel according to claim 8, wherein the display panel comprises a transparent substrate, a light-emitting layer, and an encapsulating layer stacked in turn, wherein the light-emitting layer comprises the electroluminescent panel having a first color electroluminescent layer, the electroluminescent panel having a second color electroluminescent layer, and the electroluminescent layer having a third color electroluminescent layer arranged in an array.

10. The display panel according to claim 8, wherein the display panel comprises a transparent substrate, a light-emitting layer, and an encapsulating layer stacked in turn, wherein the light-emitting layer comprises the electroluminescent panel having a white electroluminescent layer, and a color film layer comprises a first color filter area, a second color filter area and a third color filter area arranged in an array.

11. A manufacturing method for an electroluminescent panel, wherein the manufacturing method comprises:

forming a first transparent electrode layer, an electroluminescent layer, a channel layer, a second transparent electrode layer, a dielectric layer, a light absorption layer and a third electrode layer stacked in turn, wherein the light absorption layer can be excited by a light emitted from the electroluminescent layer to generate photocarriers, and the photocarriers are collected via the channel layer and injected into the electroluminescent layer, the electroluminescent layer comprises at least one of a blue electroluminescent layer having a blue light-emitting wavelength, a green electroluminescent layer having a green light-emitting wavelength and a red electroluminescent layer having a red light-emitting wavelength, the light absorption layer is a quantum dot (QD) layer, if the electroluminescent layer comprises the blue electroluminescent layer, the QD layer comprises green light QDs having a green light-emitting wavelength or yellow light QDs having a yellow light-emitting wavelength, if the electroluminescent layer comprises the green electroluminescent layer, the QD layer comprises yellow light QDs having a yellow light-emitting wavelength, if the electroluminescent layer comprises the red electroluminescent layer, the QD layer comprises near-infrared light QDs having a near-infrared light-emitting wavelength, and the QD layer has a thickness of 5-500 nm.

12. The manufacturing method according to claim 11, wherein the QDs in the QD layer have a particle diameter of 5-20 nm.

13. The manufacturing method according to claim 11, wherein the QD layer comprises one or more of a group II-VI elements core-shell structure, a group III-V elements core-shell structure, a transition metal doped nanocrystal, a rare earth metal doped nanocrystal, or a lead-based perovskite nanocrystal.

14. The manufacturing method according to claim 11, wherein the third electrode layer is a transparent electrode layer.

* * * * *